United States Patent
Dirksen et al.

(10) Patent No.: US 8,067,147 B2
(45) Date of Patent: Nov. 29, 2011

(54) REMOVABLE PELLICLE FOR IMMERSION LITHOGRAPHY

(75) Inventors: Peter Dirksen, Leuven (BE); Robert Duncan Morton, Crolles (FR); Peter Zandbergen, Leuven (BE); David Van Steenwinckel, Leuven (BE); Yuri Aksenov, Leuven (BE); Jeroen Herman Lammers, Eindhoven (NL); Johannes Van Wingerden, Leuven (BE); Laurent Marinier, Leuven (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 997 days.

(21) Appl. No.: 10/596,647

(22) PCT Filed: Dec. 22, 2004

(86) PCT No.: PCT/IB2004/052886
§ 371 (c)(1),
(2), (4) Date: Jun. 20, 2006

(87) PCT Pub. No.: WO2005/064409
PCT Pub. Date: Jul. 14, 2005

(65) Prior Publication Data
US 2007/0064215 A1 Mar. 22, 2007

(30) Foreign Application Priority Data

Dec. 23, 2003 (EP) .................................. 03104940
May 28, 2004 (EP) .................................. 04102397

(51) Int. Cl.
*G03F 7/00* (2006.01)

(52) U.S. Cl. ......... 430/322; 430/296; 430/311; 430/325

(58) Field of Classification Search ............... 430/271.1, 430/273.1, 296, 311, 322, 325
See application file for complete search history.

(56) References Cited

U.S. PATENT DOCUMENTS 2,373,289 A * 4/1945 Brown .......................... 430/538
(Continued)

FOREIGN PATENT DOCUMENTS

EP 0521296 * 1/1993
(Continued)

OTHER PUBLICATIONS

Yusuke Takano et al, "Top Antireflective Coating Process for 193nm Lithography", 1D-6-7, AZ Electronic Materials/Clariant, Japan; Taiwan Semiconductor Manufacturing Co., Taiwan, R.O.C., XP10577408A, p. 136.

(Continued)

*Primary Examiner* — Thorl Chea

(57) ABSTRACT

A method of irradiating to pattern a photosensitive layer such as a resist (L2) immersed in a fluid (L3), involves applying a removable transparent layer (L4, L5), projecting the radiation onto the resist through the immersion fluid and through the transparent layer, such that imperfections in the fluid are out of focus as projected on the surface, and subsequently removing the transparent layer. The transparent layer can help distance such imperfections from the focus of the radiation on the surface and so can reduce or eliminate shadowing. Hence the irradiation can be more complete, and defects reduced. It can be particularly effective for imperfections in the form of small bubbles or particles in the immersion fluid especially at the fluid/surface interface for example. The radiation can be for any purpose including inspection, processing, patterning and so on. The removal of the transparent layer can be combined with a step of developing the resist layer.

17 Claims, 13 Drawing Sheets

U.S. PATENT DOCUMENTS

Figure 1B:
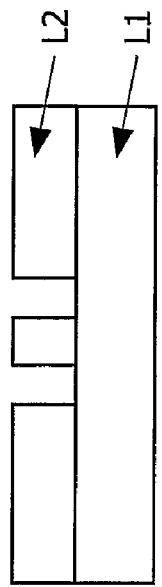

| | | | |
|---|---|---|---|
| 4,379,831 A | 4/1983 | Lobach | |
| 4,509,852 A | 4/1985 | Tabarelli et al. | |
| 5,373,806 A | 12/1994 | Logar | |
| 5,472,550 A | 12/1995 | Periasamy | |
| 5,610,683 A | 3/1997 | Takahashi | |
| 5,900,354 A | 5/1999 | Batchelder | |
| 6,040,116 A * | 3/2000 | Telser et al. | 430/306 |
| 6,555,234 B1 | 4/2003 | Piao | |
| 2005/0036184 A1* | 2/2005 | Yeo et al. | 359/15 |
| 2005/0042554 A1 | 2/2005 | Dierichs et al. | |
| 2005/0069819 A1 | 3/2005 | Shiobara | |
| 2005/0123863 A1 | 6/2005 | Chang et al. | |
| 2007/0031755 A1 | 2/2007 | Hirayama et al. | |

FOREIGN PATENT DOCUMENTS

| | | |
|---|---|---|
| EP | 0521296 A1 | 1/1993 |
| EP | 1075672 B1 | 2/2001 |
| JP | 01008583 A | 1/1989 |
| JP | 07029799 A | 1/1995 |
| JP | 07220990 A | 8/1995 |
| JP | 2005099648 A | 4/2005 |

OTHER PUBLICATIONS

P.W. Barber et al, "Light Scattering by Particles: Computational Methods", Advanced Series in Applied Physics, World Scientific, 1990.

* cited by examiner

REMOVABLE PELLICLE FOR IMMERSION LITHOGRAPHY

This invention relates to methods and materials for radiating a surface immersed in a fluid especially radiating with ultraviolet, deep ultraviolet or vacuum ultraviolet radiation, to materials and methods of patterning a resist layer, to methods of removing such layers, to blanks for patterning, and to products made by such methods and to apparatus for carrying out such methods.

It is known to produce or process smaller features on substrates by irradiating through a fine mask or steering a focused beam for example. Examples of products made using such processes can include semiconductor integrated circuits and optical devices such as high density optical storage discs. A number of problems arise as the feature size is reduced to achieve integration of more components or features on a given size of substrate. For example the wavelength of the electromagnetic radiation may limit the feature size, and fine particles of dust can cause critical defects.

It is known from U.S. Pat. No. 5,610,683 to immerse the substrate in a fluid having a higher refractive index than air and apply a pattern to the substrate lithographically. This can improve the depth of focus and effectively reduce the minimum feature size. It is acknowledged in later U.S. Pat. No. 5,900,354 that immersion optics had been avoided for semiconductor lithography and inspection for four reasons:

Bubbles at the fluid/resist interface can scatter light and cause shadows which cause defects.

It can be hard to remove all traces of the fluid.

The fluid can carry contaminants or can otherwise damage existing features.

Process steps to counter the first three problems can add process complexity and cost. U.S. Pat. No. 5,900,354 suggests using a super critical fluid.

It is also known from EP 1,075,672 to address the problem of unwanted particle deposition onto masks and wafers during conventional non-immersion lithography. It is mentioned that masks can be coated with a protective membrane of silicon, although it is suggested that such membranes are not suitable for advanced lithography using high energy radiation of photons, electrons ions or atoms, and suggests instead using thermophoresis to avoid such deposition.

This document also mentions that surface defects can be related to particulate matter being deposited onto surfaces of reticles (masks) and wafer substrates during the various operations required to produce integrated circuits. It indicates that the need to maintain these surfaces substantially free of particulate matter has long been recognized in the microelectronics industry and various schemes to do so have been proposed, such as those set forth in U.S. Pat. Nos. 5,373,806 and 5,472,550. The former discloses the use of thermal energy, such as the use of radiant energy, RF, or resistance heating, to substantially eliminate electrostatic attraction as a mechanism for particle transport and deposition during gas phase processing while the latter describes the use of the photophoretic effect to capture particles by projecting a laser beam inside the processing chamber along a trajectory that does not contact the substrate surface.

The concern about printable defects caused by particle deposition onto surfaces is said to be of particular importance for the next generation of lithographies, including proximity x-ray lithography, direct-write and projection electron-beam lithography (SCALPEL), direct-write and projection ion-beam lithography, and extreme ultraviolet (radiation having a wavelength in the region of 3.5-15 nm) lithography (EUVL) which must provide for exclusion of particles with diameters greater than 0.01 µm. Because of the importance of protecting lithographic surfaces, such as reticles, from deposition of particulate matter for next generation lithographies alternative protection schemes such as clean encapsulation of the exposure chamber, protective gas blankets, and in-situ cleaning of mask surfaces have been investigated. However, each of these alternative schemes has disadvantages and none have been developed successfully.

It is an object of the invention to provide improved materials and processes or apparatus for lithography.

According to a first aspect, the invention provides a method of irradiating a surface immersed in a fluid with a radiation source, the method comprising:

applying a removable transparent layer to the surface, projecting radiation onto the surface through the immersion fluid and through the transparent layer, and subsequently removing the transparent layer.

The thickness of the removable transparent layer is preferably such that certain imperfections in the fluid are out of focus as projected onto the surface. It is estimated that the total required thickness of the removable transparent layer should be such that the Strehl Ratio is not less than 95%. The Strehl ratio indicates the difference between intensity of an ideal and a disturbed Point Spread Function (PSF). The disturbed PSF is caused by a particle or bubble. A critical situation is when the particle or bubble is as close as possible to the substrate to be processed, for example when the particle or bubble is touching the surface of the removable transparent layer. The thickness of the removable transparent layer is 200 nm or greater, e.g. 500 nm or greater, 1 micron or greater or 5 micron or greater. The required thickness will depend upon the expected size of the particles or bubbles as well as the optical characteristics of the optical system. Typically the immersion medium, whether gas or liquid, has an index of refraction at the wavelength of the radiation source which is higher than that of air/vacuum. For most practical purposes this is a liquid, preferably water.

An advantage of the transparent layer is that it helps distance certain imperfections from the focus of the radiation on the surface and so can reduce or eliminate shadowing. Hence, the irradiation can be more complete, and defects reduced. It can be particularly effective for imperfections in the form of particles or small bubbles in the immersion fluid, e.g. at the fluid/surface interface. Bubbles can originate from the liquid itself or may be produced by gas escaping from a solid layer or adsorbed thereon. Larger bubbles or particles are rarer and can be dealt with in other ways. The radiation can be for any purpose including inspection, processing, patterning and so on. The immersion fluid can be any fluid including high refractive index liquids or gases.

Additional features which can form dependent claims include the surface comprising a photosensitive layer such as a resist layer, and the projecting comprising projecting a pattern onto the photosensitive layer, e.g. to pattern the resist layer. Such photosensitive layers, e.g. resist layers, can be particularly sensitive to defects and in many cases a single defect can ruin the entire substrate. The patterned resist layer can be used as a mask in a further lithographic step, e.g. to pattern an underlying layer such as a semiconductor, conducting or insulating layer.

Another such additional feature is the removal of the transparent layer preceding or being combined with a step of developing the resist layer.

The transparent layer can be removed by any suitable chemical or mechanical method or, for example, by a heat treatment step. Mechanical methods of removing the transparent layer can be by cleavage. Chemical methods include wet or drying etching. Combinations of chemical and mechanical methods can be used, e.g. Chemical Mechanical Polishing. A particularly preferred method is the transparent layer being partly or completely dissolved by a fluid, which could be the same fluid as is used for developing the resist. This can make the process easier since no additional removal step is needed. Properties of the transparent layer may be changed by incidence of radiation and/or by heat treatment. The solubility of the transparent layer may be altered after the immersion in the immersion fluid. This can be particularly useful if the immersion fluid and the developer are both water based for example. The radiation used to change the solubility properties preferably has a different wavelength than that used to pattern any underlying photosensitive layer(s). For example, another such additional feature is the altering being carried out by a post exposure bake process or that the altering is carried out by a flood exposure at a wavelength different from that of the actinic radiation used for patterning photosensitive layer(s).

In a preferred embodiment the solubility of the transparent layer and of the exposed or non-exposed part of the resist are different in a developing solution so that the transparent layer may be removed easily by release or dissolution during the developing step. Preferably, during the initial immersion step the transparent layer is not dissolved or removed, e.g. when the immersion liquid is water or another liquid such as a non-basic aqueous solution. The development solution may be basic, e.g. in a range of pH of 9 or above, e.g. 13-14, and immersion in this liquid results in release or removal of the protective layer, e.g. by dissolution. The developer can be a basic aqueous solution. Alternatively, the initial immersion liquid may be basic, e.g. of pH 9 or above, e.g. 13-14 and the developer solution may be another liquid, e.g. water or a non-basic aqueous solution. In accordance with specific embodiments there is differential solubility in the initial immersion liquid and the developer solution. It is preferred in this embodiment if the transparent layer is a single layer of transparent material.

Another such additional feature is the transparent layer comprising an upper and a lower layer, the upper layer having an alterable solubility. The use of multiple layers can make it easier to retain existing process steps without modification, for example resist coating through to resist development steps.

Another such additional feature is the lower layer having a filter function to protect the resist layer from the altering step.

Typically the lithographic methods of the present invention will be used in processing of semiconductor, metal, dielectric or polymeric materials for the manufacture of electronic devices and components such as integrated circuits.

Another aspect of the invention provides a method of patterning a photosensitive layer such as a resist covered by a transparent protective layer, having the steps of projecting a pattern through the transparent protective layer onto the photosensitive layer such as the resist, altering the solubility of the protective layer, and removing the protective layer. The method may include developing the resist before removing the protective layer. This helps show that it is not always essential to include the steps of forming the transparent layer, nor essential that the resist be immersed. The abovementioned additional features can apply to this or other aspects.

Another aspect of the invention provides a method of removing a removable protective layer comprising dissolving or releasing the layer by action of the developing solution so that the transparent layer may be removed easily during the developing step. During the initial immersion step the transparent layer is not dissolved or removed, e.g. when the immersion liquid is water, the development solution may be basic—e.g. in the range of pH from 9 and above, e.g. 13-14, and may result in the protective layer being released or dissolved. Alternatively, the initial immersion liquid may be basic, e.g. of pH 9 or above, e.g. 13-14 and the developer solution may be another liquid, e.g. water, and the protective layer is released or removed, e.g. dissolved by the water. In accordance with specific embodiments use is made in the method of differential solubility in the initial immersion liquid and the developer solution. It is preferred in this embodiment if the transparent layer is a single layer of transparent material.

Another aspect of the invention provides a method of removing a removable protective layer comprising the steps of immersing the layer without dissolving it, altering the solubility of the layer by a flood radiation step, then dissolving the layer. Again this helps to show that it is not always essential to include the steps of forming the transparent layer, or irradiating through the layer or immersing the layer.

Another aspect of the invention provides a blank suitable for patterning, having a photosensitive layer such as a resist layer, and a removable transparent protective layer, the removable protective layer being formed of a material of alterable solubility. Such blanks can be separately tradeable, valuable products and articles of manufacture.

Another aspect provides a product manufactured by any of the above methods. In particular this can encompass an integrated circuit, a mask for creating other products, an optical master disc, and optical discs produced from such a master, for example.

Another aspect provides apparatus arranged to carry out any of the above methods.

Other advantages will be apparent to those skilled in the art, particularly in view of other prior art not known to the inventors. Any of the additional features above may be combined together, or combined with any of the aspects of the invention. How the present invention may be put into effect will now be described with reference to the appended schematic drawings. Obviously, numerous variations and modifications can be made without departing from the claims of the present invention. Therefore, it should be clearly understood that the form of the present invention is illustrative only and is not intended to limit the scope of the present invention.

Figure 1D:
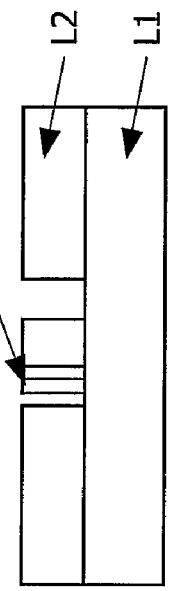
Figure 1A:
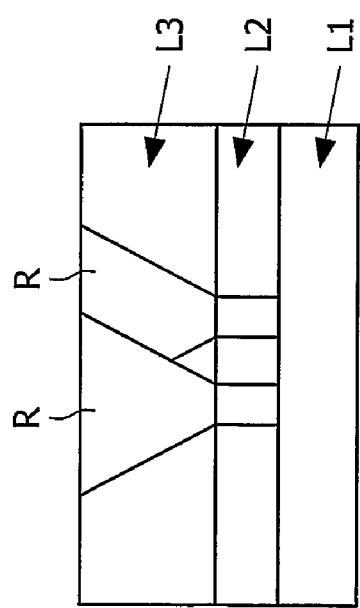
Figure 1C:
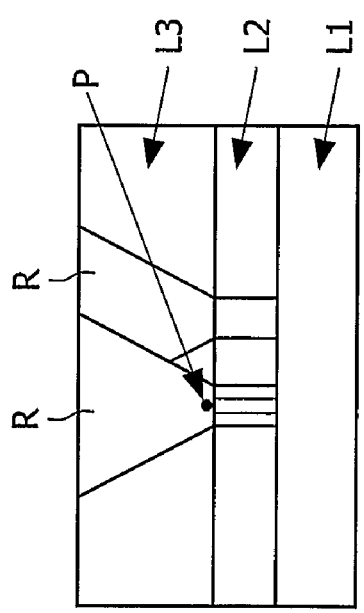
Figure 2B:
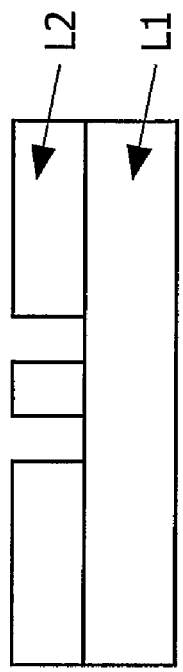
Figure 2A:
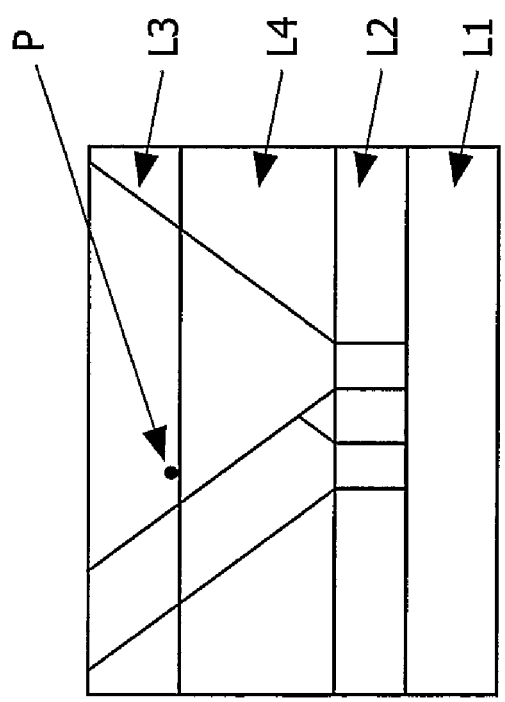

The features of the invention will be better understood by reference to the accompanying drawings, which illustrate preferred embodiments of the invention. In the drawings:

FIGS. 1a-1d shows a schematic view of a process illustrating a problem to be addressed, FIGS. 2a and 2b show a similar schematic view of an embodiment of the invention, FIGS. 3 and 4a-4d show another embodiment using a bilayer pellicle with a solubility of the top layer altered during resist exposure, and showing steps in exposing through the pellicle and removing the pellicle, FIGS. 5a-5d show another embodiment using a bilayer pellicle with a solubility of the top layer altered by a flood exposure prior to a post exposure bake, FIGS. 6a-6d show another embodiment using a bilayer pellicle with a solubility of the top layer altered during a post exposure bake, FIGS. 7, 8a-8d show another embodiment using a single layer pellicle with a solubility of the top layer altered by a flood exposure prior to a post exposure bake, and FIGS. 9a-9d show further embodiments using a single layer pellicle with a solubility of the top layer altered during a post exposure bake.

FIGS. 9e-9h show a further embodiment using a single layer pellicle with a solubility of the top layer being different in developer solution.

Figure 10:
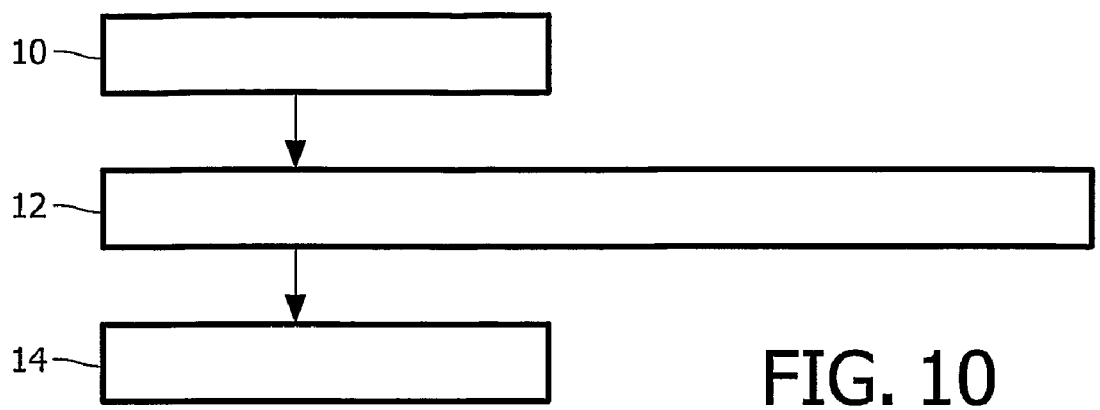
Figure 11:
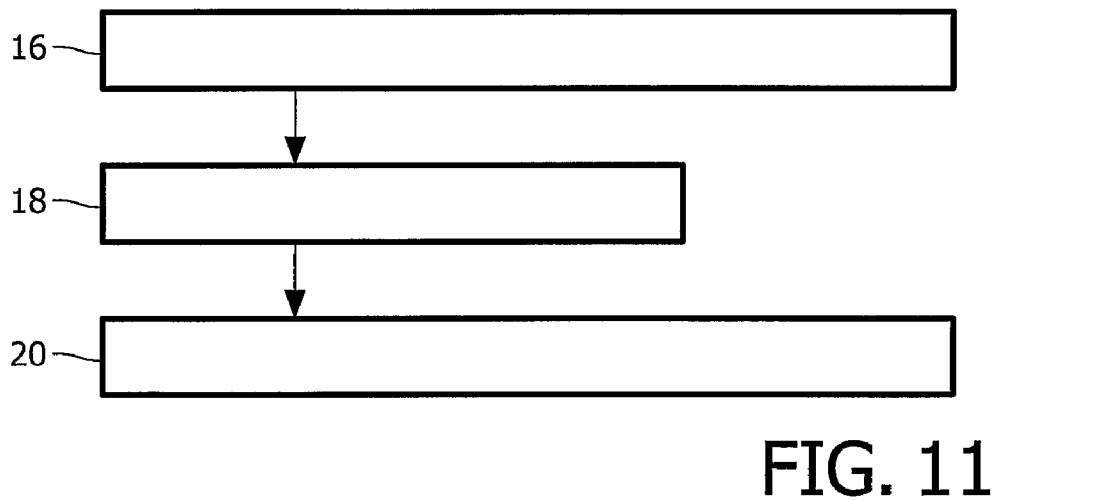
Figure 12:
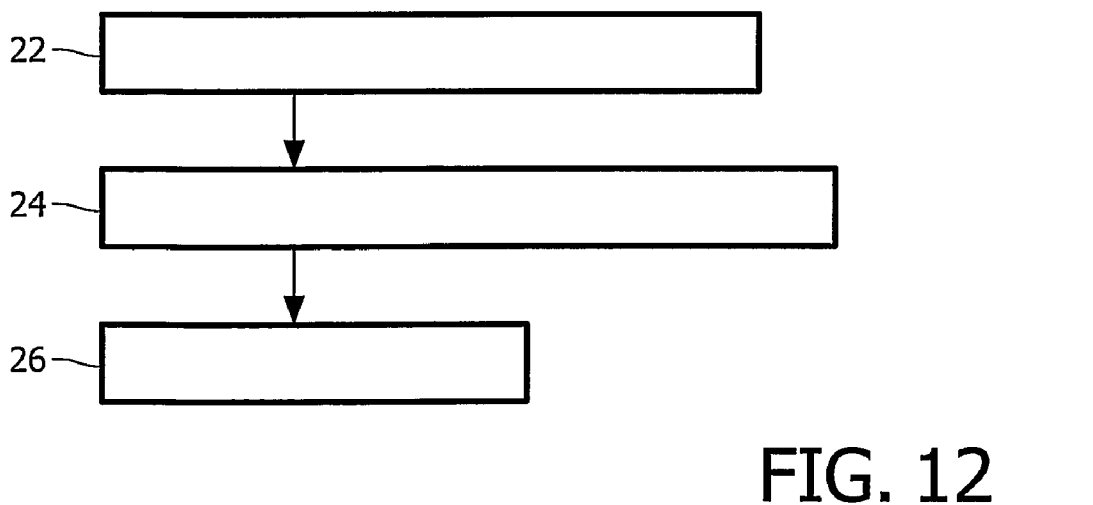
Figure 13:
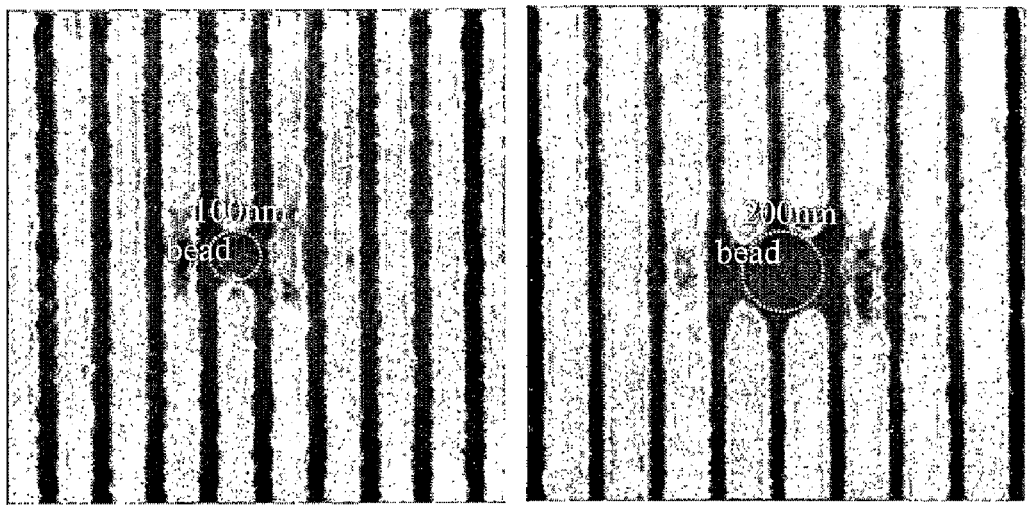
Figure 14:
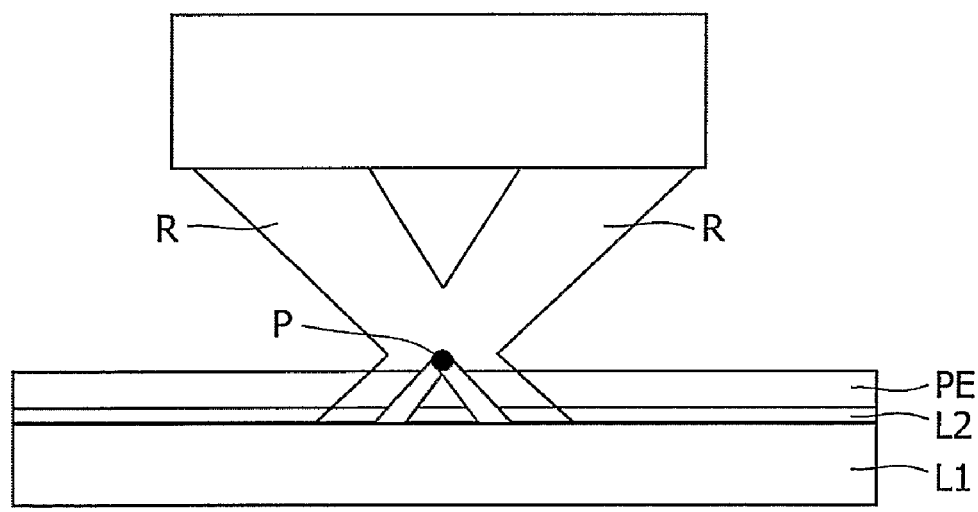
Figure 15:
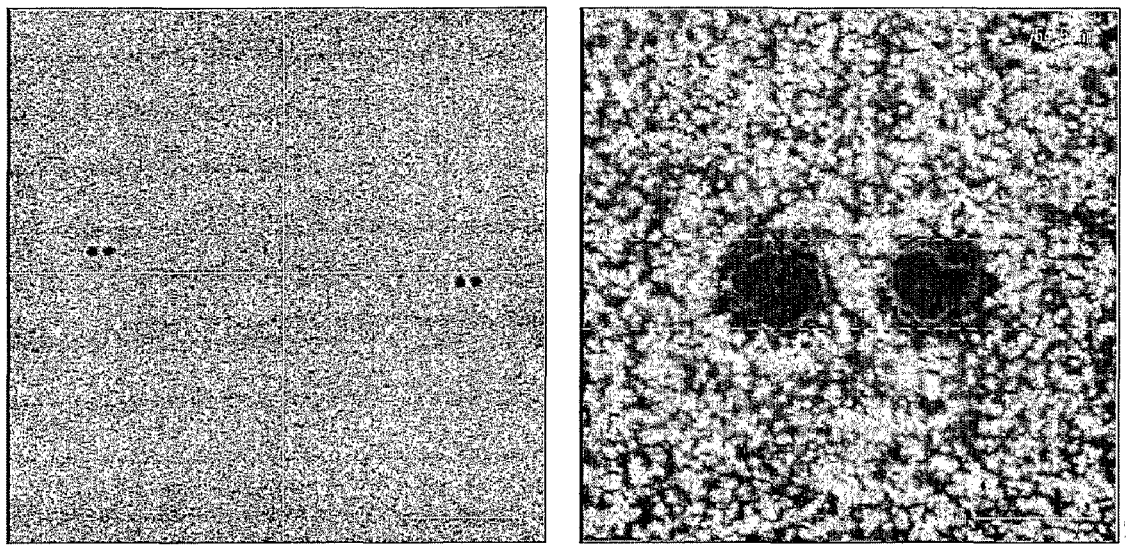

FIGS. 10-12 show process flows in accordance with embodiments of the present invention, FIG. 13 shows a SEM image of a polystyrene beads of 100 nm (left) and 200 nm (right) in diameter printed in the resist without using a pellicle according to the invention, FIG. 14 shows the principle of the nano-particles detection using dipole illumination, and FIG. 15 shows a SEM image (left) of two particles each creating a sharp image of the dipole illumination source that prints as two particle shapes in the photo resist, shown in magnification (right).

Same reference signs indicate same or similar elements in the Figures.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale. for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The present invention will be described mainly with reference to altering the solubility of a transparent protective layer but the present invention is not limited to this method. The transparent layer can be removed by any suitable chemical or mechanical method or, for example, by a heat treatment step. Mechanical methods of removing the transparent layer can be by cleavage. Chemical methods include wet or drying etching. Combinations of chemical and mechanical methods can be used, e.g. Chemical Mechanical Polishing. The particularly preferred method is the transparent layer being partly or completely dissolved by a fluid, which could be the same fluid as is used for developing the resist. This can make the process easier since no additional removal step is needed. Properties of the transparent layer may be changed by incidence of radiation and/or by heat treatment. The solubility of the transparent layer may be altered after the immersion in the immersion fluid. This can be particularly useful if the immersion fluid and the developer are both water based for example. The radiation used to change the solubility properties preferably has a different wavelength than that used to pattern any underlying photosensitive layer(s). For example, a post exposure bake process or a flood exposure at a different wavelength to the actinic radiation used for patterning photosensitive layer (s) may be used to change the solubility characteristics.

Embodiments of the invention will be described in the context of immersion lithography though other applications, other than lithographic patterning, are included within the scope of the present invention, e.g. irradiation for inspection or for other processing steps, and examples of other types of immersion. For example, the present invention can be used in patterning of microelectronic circuits or mastering of high-density optical discs. FIGS. 1a-d show for reference a process showing an effect of one of the key concerns in immersion lithography, the formation of defects in the exposed resist pattern as a result of light being scattered from bubbles/particles present in the immersion fluid during exposure. The immersion medium can have an index of refraction at the wavelength of the radiation to be used in the optical system which is higher than that of air/vacuum. For most practical purposes this is a liquid, preferably water.

The wavelength of light typically used for lithography is similar to UVC, i.e. in the range 90 to 280 nm. For particle sizes less than 10% of the wavelength there is little scatter, i.e. less than 1%. Thus, particles or bubbles of the order of 10 nm to 20 nm are probably not significant in many practical applications and equipment. Using a wavelength of 193 nm it has been estimated that a pellicle thickness of 200 nm or more is required to guarantee a Strehl ratio above 95% for a bubble of 50 nm in conventional lithographic equipment. Similarly, for 100 nm bubbles, a pellicle thickness of 1100 nm or more is preferred and for a bubble size of 200 nm a pellicle thickness of 3400 nm or more is preferred. For more advanced methods of computing scattered energies for spherical and other objects which can be used to optimize the thickness of the transparent layer, see "Light Scattering by particles: Computational Methods", P. W. Barber and S. C. Hill, World Scientific, 1990.

In FIG. 1a radiation R in the form of light from a source (not shown) is shone down onto a surface exemplified in the form of a photosensitive layer such as a resist layer L2 on a substrate L1. The radiation may be visible, infra-red, ultraviolet, e.g. deep ultraviolet (DUV), actinic, or vacuum ultraviolet (VUV) radiation, or other forms of electromagnetic radiation. The photosensitive layer is not limited to a resist layer, e.g. it may also be made of a material such as photosensitive BCB which after development provides a patterned insulating layer, e.g. in the formation of capacitors. In the following reference will be made to resist in the context of examples of application of the invention, however wherever the word "resist" occurs it should be understood that any photosensitive layer is also disclosed and included within the scope of the present invention. The radiation is focused by a lens or other projection system (not shown) to form a pattern of two lines or points on the resist. The substrate is immersed in an immersion fluid L3, so that the radiation, e.g. light passes through the immersion fluid to reach the resist. FIG. 1b shows the result after exposure, removal of the immersion fluid and development of the resist. The pattern remains in the resist, and the substrate can proceed to further processing steps (not shown). In FIGS. 1c and 1d, the effect of a small imperfection in the immersion fluid such as a particle or bubble P at the boundary of the immersion layer and the resist layer is shown. This particle creates a shadow on the resist during exposure. The result after development, shown in FIG. 1d is a defective pattern DP in the resist which can lead to a defective end product.

The proposed solution to this problem is the use of a transparent spacing layer L4 termed an 'immersion pellicle' or optical spacer. The 'immersion pellicle' is designed to ensure that small bubbles/particles P, which are present in the immersion fluid L3, e.g. at the fluid/pellicle interface, are kept sufficiently 'out of focus' during exposure of a surface, e.g. a photosensitive. Larger bubbles or particles which are large enough to shadow the surface are rarer, and easier to detect and remove by other means such as filtering or heating for example. FIGS. 2a and 2b show an example in the context of a process for exposing a pattern on a resist film on a substrate, which demonstrate that a particle P present during illumination, FIG. 2a, does no longer lead to a defective pattern after development, see FIG. 2b.

A useful additional feature of this 'immersion pellicle' is that, in addition to providing particle protection to the resist film, it is preferably easily removable after exposure, but prior to, or during the subsequent development of the resist. This removable 'immersion pellicle' can consist of a single or multiple layers, depending on the properties of the constituent materials and the preferred process flow. However, the total thickness of the pellicle should be sufficient to ensure that any particles that settle on the top surface of the pellicle are sufficiently far from the focal point of the optical system, so as not to impact the quality of the image projected onto the resist. For example, for a 50 nm bubble a pellicle thickness of between 200 nm and 1000 nm, e.g. between 500 and 1000 nm would be sufficient, depending on the projection arrangement of the radiation and its wavelength.

A number of pellicle designs are possible. It is useful but not essential if the pellicle is designed to be insoluble in the immersion fluid, whilst being soluble in the developer. In the case of 193 nm and 248 nm lithography both the immersion fluid and developer are water based, thus altering, which includes switching, of the solubility of the pellicle is needed if a separate pellicle removal step is to be avoided. In the following paragraphs several single and bi-layer pellicle embodiments are described, to enable such altering.

FIGS. 3 and 4a-4d, EXAMPLE 1

This example is notable for the bi-layer pellicle PE consisting of a developer soluble bottom layer L4 and a photosensitive top layer L5 for which solubility switching is initiated during resist exposure. The developer may be water based. The bottom layer L4 may be water soluble. For this embodiment, the basic materials are commercially available. The bottom layer L4 may be made of materials used as antireflective coatings such as AZ Aquatar, JSR Microelectronics NFC520/NFC640 coatings. Optionally, an adhesive layer may be applied between the bottom layer L4 and the top layer L5, e.g. a primer such as HMDS or TMSDEA. Processing can be carried out using existing processing equipment, or the existing equipment can be adapted to automate the new steps.

Figure 3:
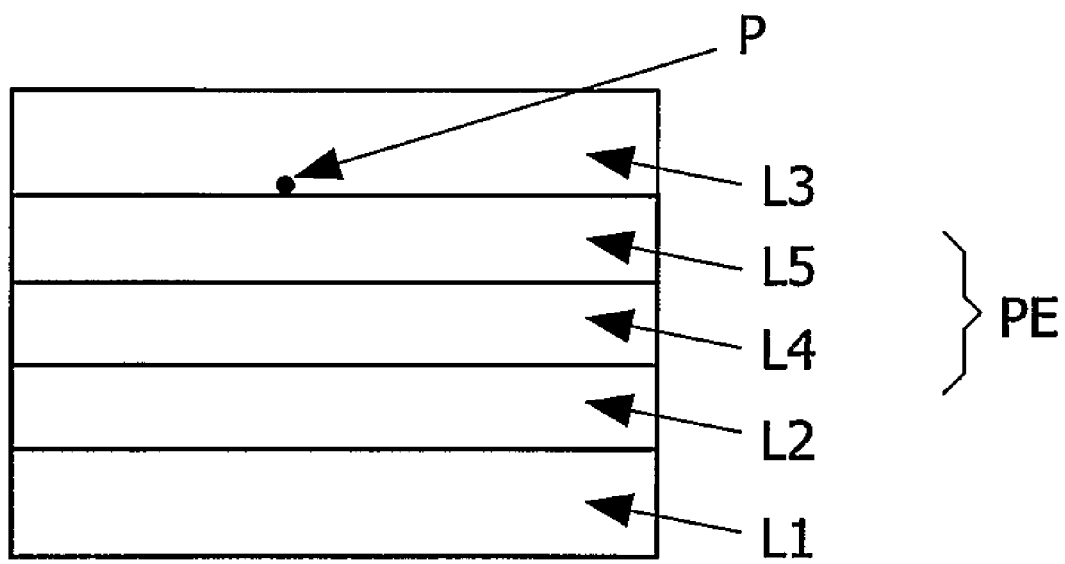

Pellicle Composition for Example 1:

A schematic drawing of a structure including the pellicle is shown in FIG. 3. L1 is a substrate, L2 is the resist, L3 is the immersion fluid, and L4 and L5 constitute the pellicle PE. The pellicle serves to space apart the resist from the immersion fluid. The pellicle is comprised of two layers; a bottom layer (lift-off material), L4, which is soluble in a resist developer solution (independent of exposure) and a photosensitive top protective layer, L5, for which solubility switching is initiated during exposure of the resist and completed during the subsequent post exposure bake (PEB). An optional adhesive layer may be applied between the lift-off layer L4 and the photosensitive layer L5.

Figure 4A:
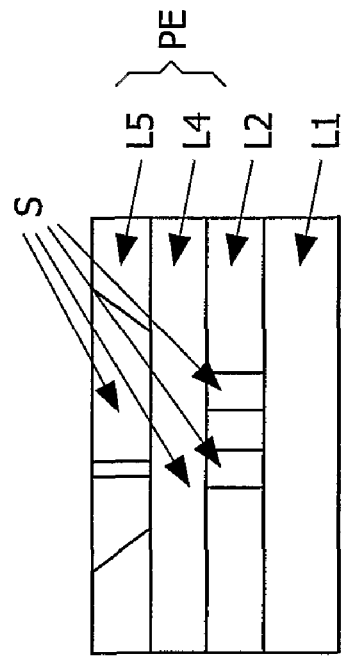
Figure 4B:
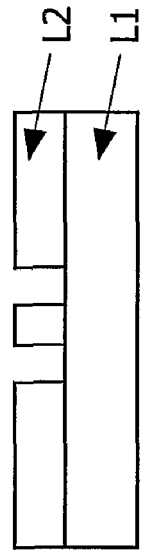
Figure 4C:
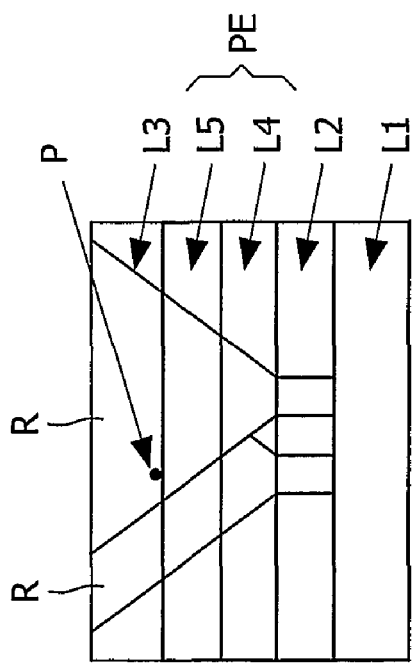

Process Flow for Example 1:

The basic process flow is as follows:
a. Spin-coat resist layer (not shown) and optional bake step;
b. Spin-coat bottom pellicle layer (not shown) and optional bake step;
c. Spin-coat top pellicle layer (not shown) and optional bake step;
d. Expose resist in scanner (FIG. 4a);
e. Post expose bake PEB resist (FIG. 4b);
f. Develop resist (FIG. 4c).

Figure 4D:
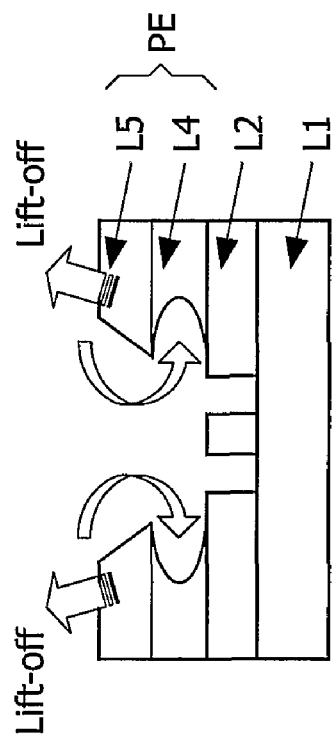

FIGS. 4a-4d schematically represents the process flow during exposure and development. The patterned radiation R may be obtained in a lithography tool having a mask or any other exposure tool, such as a scanner, stepper or step-scan tool. The formation of the layers can be carried out by conventional methods such as spin coating or other methods. As such methods of formation are well known, they need not be described further here. During exposure of the wafer, in addition to exposing selected regions in the resist L2, regions in the pellicle top layer L5 are also exposed see FIG. 4a. Again, such exposure methods and apparatus to project a pattern onto the resist and focus it accurately, are well known and need not be described here in more detail. If this top layer is based on a chemically amplified (CA) resist chemistry, the dissolution characteristics of this top layer L5 will remain substantially unchanged until after the subsequent PEB. As a result of the PEB step, the exposed regions of the top pellicle layer L5 will become soluble in developer solution as is indicated by soluble regions S in FIG. 4b. Thus during development of the wafer, the exposed regions S of the top protective layer L5 will dissolve exposing the soluble bottom pellicle layer L4 and exposed resist L2 to the developer solution, allowing these layers to be developed, and lift-off of the unexposed regions of the top pellicle layer to occur, see FIG. 4c. FIG. 4d shows the result after lift off, showing the patterned resist L2, ready for any further process steps (not shown).

An advantage of this process is that all processing between resist coating and development can be carried out in an existing standard lithographic system without modification to the apparatus. In principle the steps of FIG. 4 and the other Figures can be used with other processes, other ways of creating the layers, other types of radiation for other purposes and other post processing steps for example. The pellicle can still serve its purpose without being completely transparent, and in some cases need not be removed, or completely removed. It can comprise more than two layers.

FIGS. 5a-5d, EXAMPLE 2

This is similar to example 1 in that a bi-layer pellicle is used. It differs in that the layers consist of a developer soluble bottom layer L4 and photosensitive top layer L5 for which solubility switching is initiated during a flood exposure subsequent to the resist exposure and prior to Post Exposure Bake (PEB). For this approach, the basic materials are commercially available, as indicated above. Processing can be carried out using existing processing equipment, although the process flow does require an additional flood exposure of the wafer to be carried out after the resist exposure, at a wavelength for which:
a) The top pellicle layer is sensitive, and
b) The bottom pellicle layer is non-transparent or the resist is non-sensitive.

Pellicle Composition for example 2 is similar to Example 1:

L1 is a substrate, L2 is the resist, L3 is the immersion fluid, and L4 and L5 are the pellicle, as shown in FIG. 3. The pellicle PE serves to space apart the resist L2 from the immersion fluid L3. The pellicle PE is comprised of two layers; a bottom layer L4 of lift-off material, which is soluble in the resist developer solution independent of exposure and a photosensitive top protective layer L5, for which solubility switching is initiated via a flood exposure of the top pellicle layer L5. The underlying resist layer L3 is 'shielded' from this flood exposure through the filtering nature of the pellicle bottom layer 14. This implies that the radiation used for flood exposure of L5 is absorbed by L4 to such an extend that the resist L2 is substantially not modified, i.e. the resist L2 after development is still patterned as desired. An optional adhesive layer may be applied between the lift-off layer L4 and the photosensitive layer L5.

Process Flow for Example 2:

The basic process flow is as follows:

g. Spin-coat resist layer (not shown) and optional bake step;
h. Spin-coat bottom pellicle layer (not shown) and optional bake step;
i. Spin-coat top pellicle layer (not shown) and optional bake step;
j. Expose resist in scanner, FIG. 5a;
k. Flood exposure of top pellicle layer by second wavelength different from first wavelength used during step j, see FIG. 5b;
l. Post expose bake PEB resist, FIG. 5c;
m. Develop resist, FIG. 5d.

Figure 5A:
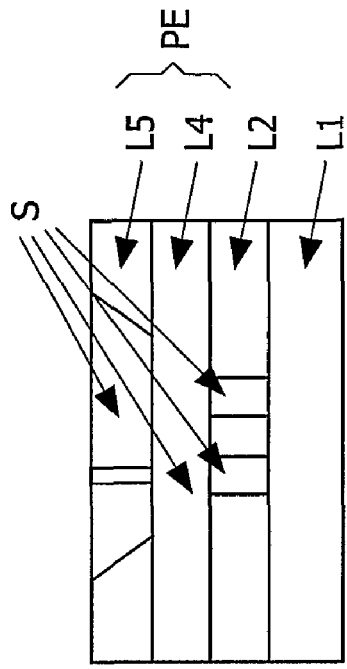
Figure 5B:
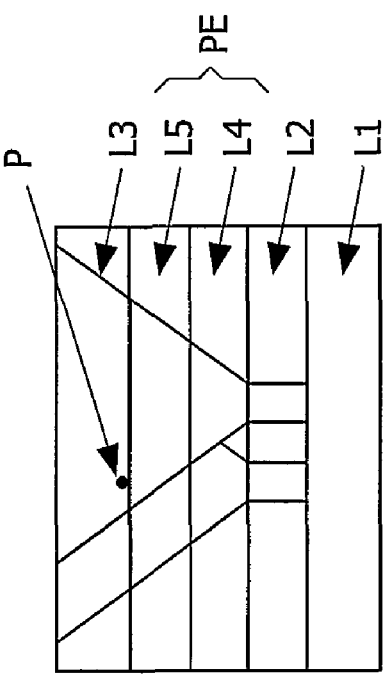
Figure 5C:
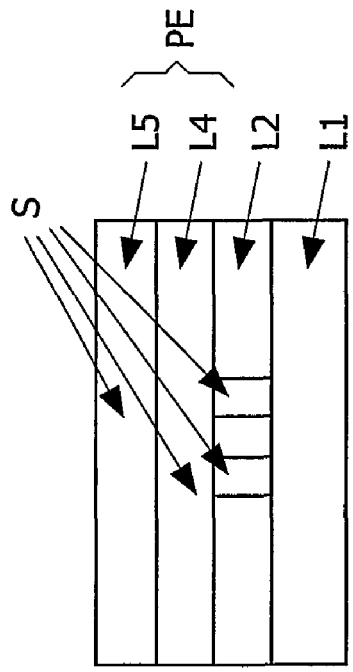
Figure 5D:
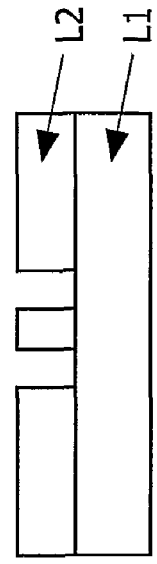
Figure 6A:
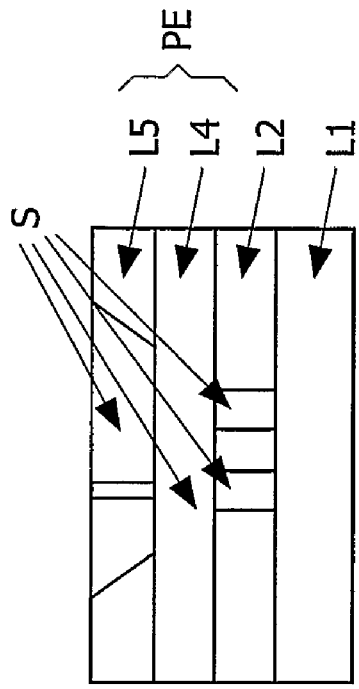
Figure 6B:
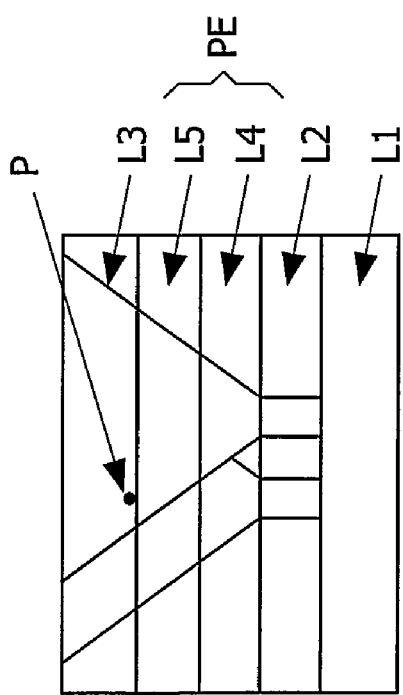
Figure 6C:
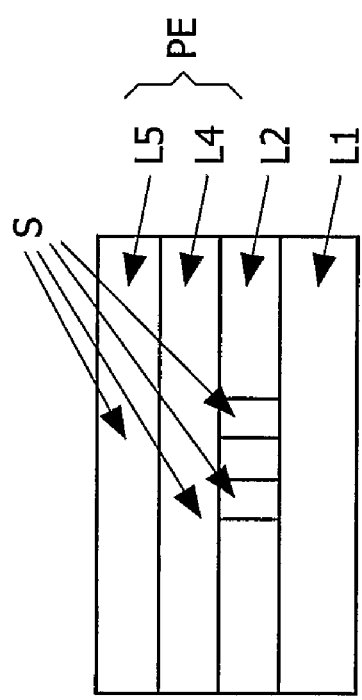
Figure 6D:
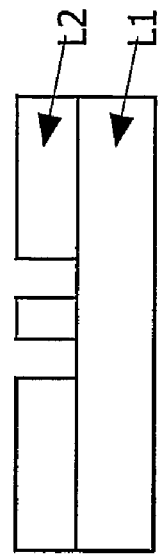

FIGS. 5a-5d schematically represent the process flow during exposure and development. The scanner can be any exposure tool such as a scanner, stepper or step-scan tool. During exposure of the wafer, in addition to exposing selected regions in the resist L2, regions in the pellicle top layer L5 may also be exposed see FIG. 5a. A subsequent flood exposure at a wavelength for which the top pellicle layer is sensitive and either the bottom pellicle layer is non-transparent, or the resist is insensitive, ensures that the top pellicle layer L5 is fully dissolvable in the resist developer solution as indicated in FIG. 5b. If this top layer L5 is based on a chemically amplified (CA) resist chemistry, the dissolution characteristics of this top layer will remain unchanged until after the subsequent PEB. As a result of the PEB step, the top pellicle layer L5 will become soluble in developer solution as is indicated in FIG. 5c. Thus during development of the wafer, the flood exposed top protective layer L5 will dissolve exposing the soluble bottom pellicle layer L4 and exposed resist L2 to the developer solution, allowing these layers to be developed resulting in the structure shown in FIG. 5d. Again an advantage is that all processing between resist coating and development can be carried out in an existing standard litho track.

FIGS. 6a-6d, EXAMPLE 3

A gain this is similar to example 1 in that a bi-layer pellicle PE is used. In this 5 case the layers consist of a developer soluble bottom layer L4 and a top layer L5 for which solubility switching is initiated via a post exposure bake PEB. For this approach, the basic materials are commercially available as indicated above. Processing can be carried out using existing processing equipment, or the existing equipment can be modified to automate the new steps.

Pellicle Composition for Example 3:

Again the structure shown in FIG. 3 is used. The pellicle PE is comprised of two layers; a bottom layer L4 of lift-off material, which is soluble in the resist developer solution independent of exposure and a top protective layer L5, for which solubility switching is initiated via a post exposure bake. The bottom pellicle layer L4 serves to prevent potential mixing of the top pellicle L5 and resist layer L2 during the spin-coating process. Switching of the solubility of the top pellicle layer L5 should occur at a temperature below that at which switching occurs for the resist layer L2. An optional adhesive layer may be applied between the lift-off layer L4 and the top layer L5.

Process Flow for Example 3:

The basic process flow is as follows:

n. Spin-coat resist layer (not shown) and optional bake step;
o. Spin-coat bottom pellicle layer (not shown) and optional bake step;
p. Spin-coat top pellicle layer (not shown) and optional bake step;
q. Expose resist in scanner, FIG. 6a;
r. Post expose bake PEB resist, FIG. 6b, and subsequent flood exposure, FIG. 6c;
s. Develop resist, FIG. 6d.

FIGS. 6a-6d schematically represent the process flow during exposure and development. The scanner can be any exposure tool such as a scanner, stepper or step-scan tool. During the subsequent post exposure bake, the solubility of the top (protective) pellicle layer L5 is switched at the portions exposed when exposing the resist. Then a flood exposure is applied such that the top pellicle layer is fully dissolvable in the resist developer solution, see FIG. 6c. During development of the wafer, the top protective layer L5 will dissolve exposing the soluble bottom pellicle layer L4 and exposed resist to the developer solution, allowing these layers to be developed, leading to the result shown in FIG. 6d. As before, an advantage is that all processing steps between resist coating and development can be carried out in an existing standard litho track with minor modifications i.e. addition of flood exposure unit.

FIGS. 7, 8a-8d, EXAMPLE 4

In this case, a single layer pellicle is used. The pellicle PE consists of photosensitive material for which solubility switching is initiated during a flood exposure subsequent to the resist exposure and prior to Post Exposure Bake PEB. For this approach, the basic materials are commercially available as indicated above. Processing can be carried out using existing processing equipment, although the process flow does require an additional flood exposure of the wafer to be carried out after the resist exposure, at a wavelength for which the pellicle layer PE is sensitive and the resist L2 is non-sensitive. Existing apparatus can be modified to automate the new steps.

Figure 7:
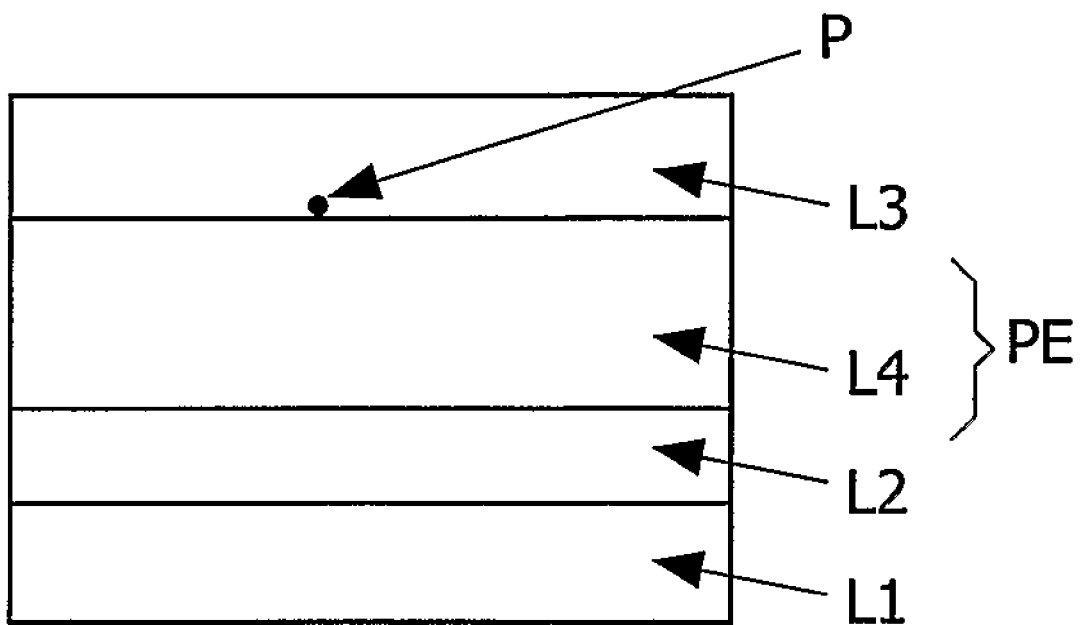

Pellicle Composition for Example 4:

As shown in FIG. 7, L1 is a substrate, L2 is the resist, L3 is the immersion fluid, and L4 is the pellicle PE. The pellicle PE is comprised of a single layer L4, for which solubility switching is initiated via a flood exposure of the pellicle layer after exposure on the resist in the scanner. The scanner can be any exposure tool such as a scanner, stepper or step-scan tool. The underlying resist layer is insensitive to the wavelength at which this flood exposure occurs.

Figure 8B:
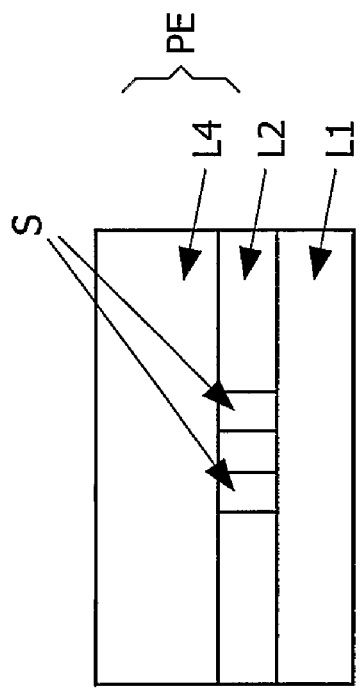

Process Flow for Example 4:

The basic process flow is as follows:

t. Spin-coat resist layer (not shown) and optional bake step;
u. Spin-coat pellicle layer (not shown) and optional bake step;
v. Expose resist in scanner, FIG. 8a;
w. Flood exposure of pellicle layer using radiation having second wavelength different from that of the radiation used in step v; FIG. 8b
x. Post expose bake PEB resist (FIG. 8c)
y. Develop resist (FIG. 8d)

Figure 8D:
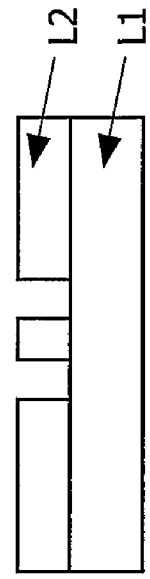
Figure 8A:
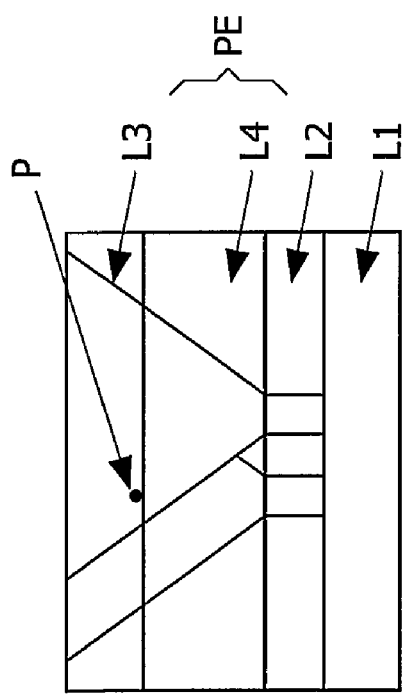
Figure 8C:
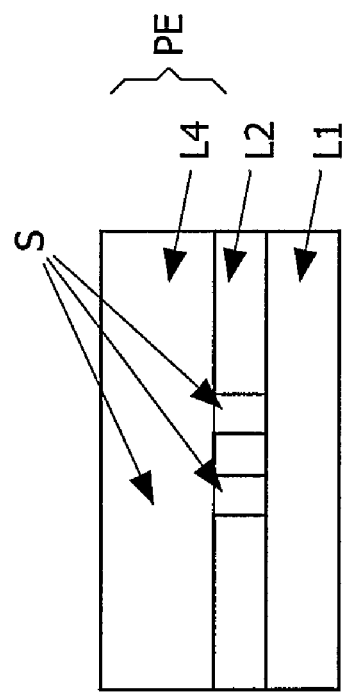

FIGS. 8a-8d schematically represent the process flow during exposure and development. The scanner can be any exposure tool such as a scanner, stepper or step-scan tool. During exposure of the wafer, in addition to exposing selected regions in the resist L2, regions in the pellicle layer L4 may also be exposed as shown in FIG. 8a. A subsequent flood exposure at a wavelength for which the top pellicle layer is sensitive and the resist is insensitive ensures that the pellicle layer is fully dissolvable in the resist developer solution. If this top layer is based on a chemically amplified (CA) resist chemistry, the dissolution characteristics of this top layer will remain unchanged until after the subsequent PEB. As a result of the PEB step, the pellicle layer L4 will become soluble in developer solution, see FIG. 8c. Thus during development of the wafer, the flood exposed protective layer L4 will dissolve exposing exposed resist to the developer solution, allowing this layer to be developed, the result of which is shown in FIG. 8d. Again an advantage is that processing can be carried out using existing processing equipment, although the process flow does require an additional flood exposure of the wafer. Existing apparatus can be modified to automate the new steps.

FIGS. 9a-9d, EXAMPLE 5

The pellicle PE consists of a material for which solubility switching is initiated during a post exposure bake PEB. For this approach, the basic materials are commercially available as indicated above. Processing can be carried out using existing processing equipment.

Pellicle Composition for Example 5:

Pellicle is comprised of a single layer, as shown in FIG. 7, for which solubility switching is initiated via a post exposure bake of the pellicle layer after exposure on the resist in the scanner. The scanner can be any exposure tool such as a scanner, stepper or step-scan tool. Switching of the solubility of the pellicle layer L4 should occur at a temperature below that at which switching occurs for the resist layer L2.

Process Flow for Example 5:

The basic process flow is as follows:
z. Spin-coat resist layer (not shown) and optional bake step;
aa. Spin-coat pellicle layer (not shown) and optional bake step;
bb. Expose resist in scanner (FIG. 9a);
cc. Post expose bake PEB resist (FIG. 9b);
dd. Develop resist (FIG. 9c).

FIGS. 9a-9d schematically represent the process flow during exposure and development. The scanner can be any exposure tool such as a scanner, stepper or step-scan tool.

Figure 9A:
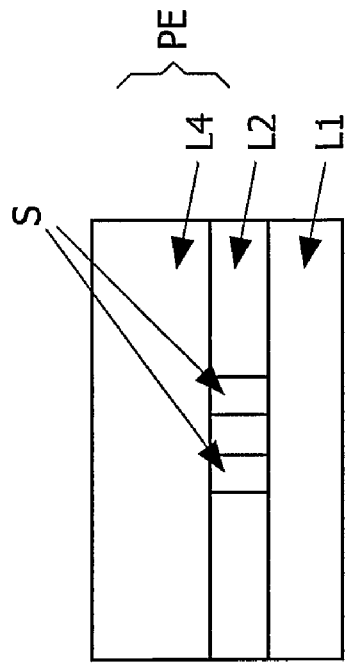
Figure 9B:
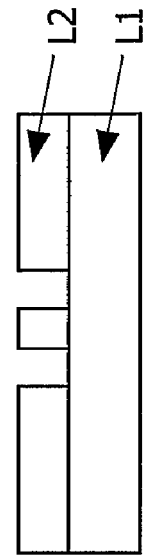
Figure 9C:
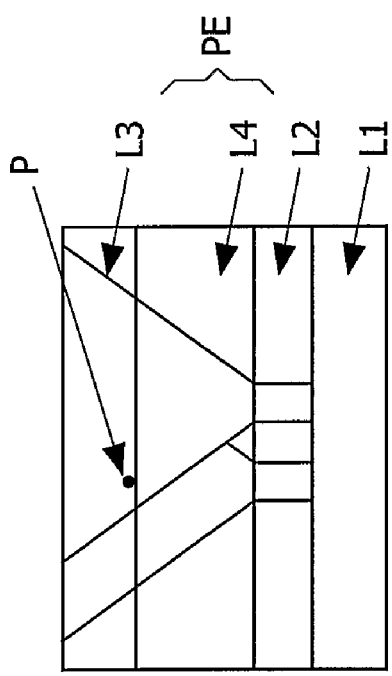
Figure 9D:
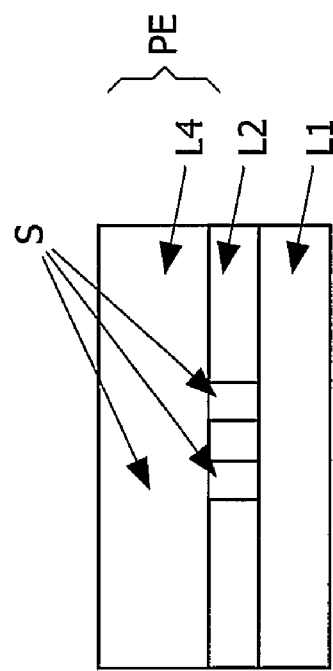
Figure 9F:
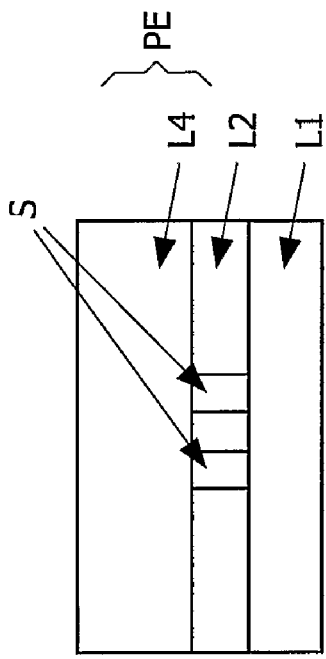

During exposure of the wafer, only resist layer L2 is modified locally, as indicated by soluble regions S in FIG. 9b. During the subsequent post exposure bake, the solubility of the pellicle layer is switched such that the pellicle layer PE is fully dissolvable in the resist developer solution as indicated by regions S in FIG. 9c. During development, the pellicle layer PE will dissolve exposing the resist L2 to the developer solution, allowing this layer to be developed, resulting in the structure of FIG. 9d. As before, an advantage is that all processing between resist coating and development can be carried out in an existing standard litho track with minor modifications, i.e. addition of flood exposure unit. Existing apparatus can be modified to automate the new steps.

EXAMPLE 6

According to a further embodiment of the present invention a further single layer pellicle layer PE and method is provided. The pellicle comprises a material that is designed to exhibit differential release properties in the initial immersion liquid and the developer solution. For example, the pellicle can be insoluble in water, but soluble in a basic or alkaline solution, e.g. standard developer. The developer solution may be adjusted to have a pH range of 9 or greater, e.g. 13-14. Such materials are available from JSR and TOK, for use as 248 and 193 nm top ARC's. Alternatively, the initial liquid may be made basic and the developer solution is water or an aqueous solution having a pH about 7 or lower. In both cases the pellicle is designed so that it is removable or releasable in the developer solution and not in the initial immersion liquid.

An embodiment of the present invention is a process providing a coating thickness of up to or greater than 500 nm. Processing can be carried out using existing processing equipment. A schematic drawing of this pellicle is shown in FIG. 7 however in this embodiment two wavelengths are not required—one is sufficient.

Figure 9H:
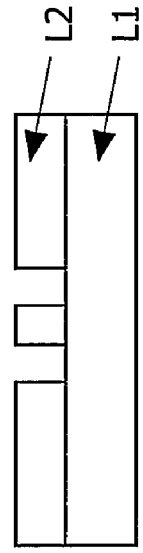
Figure 9E:
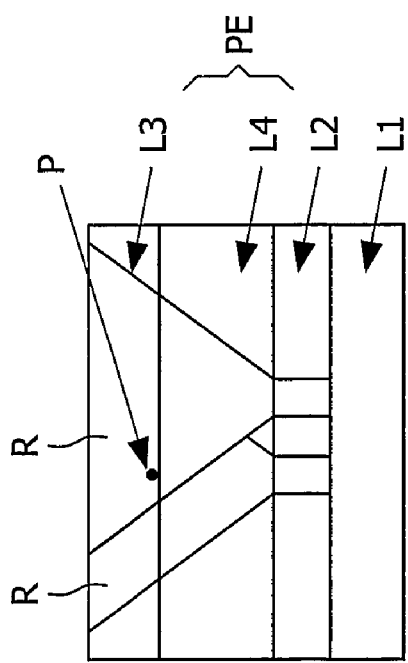

The basic process flow is as follows:
Spin-coat resist layer (not shown) and optional bake step;
Spin-coat pellicle layer (not shown) and optional bake step;
Expose resist in scanner, FIG. 9e analogous to FIG. 9a;
Post expose bake PEB resist after having exposed the resist. This locally changes the solubility in the resist L2, see regions S in FIG. 9f;
Develop pellicle and resist layers FIG. 9g;
FIG. 9h schematically represents the process flow during exposure and development. During exposure of the wafer, only resist layer is exposed (FIGS. 9e and f).

Figure 9G:
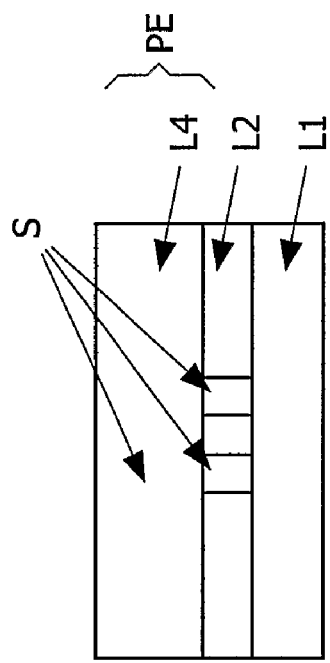

During development of the wafer, the pellicle layer will dissolve or be released in the developer solution thus exposing the resist to the developer solution, allowing this layer to be developed (FIG. 9g). The final result being shown in FIG. 9h.

Suitable materials for the pellicle, each of which is an embodiment of the present invention, can be:
a) Polyvinyl alcohol which is soluble in water but not in a basic solution. In this case the developer solution would be water or a non-basic aqueous solution.
b) Polyvinylphenol which is soluble in a basic solution but not in water or a non-basic aqueous solution.
c) Polymethacrylic acid which is soluble in a basic solution but not in water or a non-basic aqueous solution.

In the embodiments b) and c) the developer would be a basic solution and the initial immersion liquid would be water or a non-basic aqueous solution.

A suitable developer would be based tetramethylammonium hydroxide (TMAH). A suitable solution would contain 2 to 3% tetramethylammonium hydroxide (CAS No. 75-59-2) and water (CAS No. 7732-18-5) 97-98%. The pH range is generally in the range 13-14.

FIGS. 10-12, Process Overviews

FIG. 10 shows an overview of a process according to an embodiment. In step 10, a transparent layer is applied to a surface. At step 12, radiation is projected through the transparent layer to focus on the surface. At step 14 the transparent layer is removed. This set of steps can be applied to a wide variety of applications. FIG. 11 shows an overview of a process according to another embodiment. At step 16, a pattern is projected onto a resist layer though a transparent layer on the resist. At step 18, the solubility of the transparent layer is altered. At step 20, the resist is developed and the transparent layer is removed, by dissolving. In FIG. 12, a surface having a protective layer is immersed at step 22. At step 24, the solubility of the protective layer is altered by light or other radiation. At step 26, the protective layer is dissolved. Again these sets of steps can be applied to a wide variety of applications.

As described above, a method of irradiating to pattern a photosensitive layer such as a resist L2 immersed in a fluid L3, involves applying a removable transparent layer L4 and L5, if present, projecting the radiation onto the photosensitive layer through the immersion fluid and through the transparent layer, such that imperfections in the fluid are out of focus as projected on the surface, and subsequently removing the transparent layer. The transparent layer can help distance such imperfections from the focus of the radiation on the surface and so can reduce or eliminate shadowing. Hence the irradiation can be more complete, and defects reduced. It can be particularly effective for imperfections in the form of small bubbles in the immersion fluid, e.g. at the fluid/surface interface. The radiation can be for any purpose including inspection, processing, patterning and so on. The removal of the transparent layer can be carried out by any suitable method, e.g. mechanical, chemical or heat treatment and may be combined with a step of developing an underlying photosensitive layer such as a resist layer. Other variations can be envisaged which are intended to be within the scope of the claims.

Another aspect of the present invention relates to detection of nano particles, i.e. particles having a dimension of less than 1 micron, in immersion lithography. It provides a novel technique to detect easily defects present in immerison lithography by printing them directly in the resist, magnified by the pellicle described above. This technique may lead to a rapid feedback on the level of defectivity to qualify system performance with a high-resolution capacity.

It is known that the resolution capability of the defectivity tools has to follow the same improvement as the one of the exposure tool used in lithography. The use of immersion lithography is thus challenging the defectivity detection not only because the resolution requirements are increasing but also because some new immersion specific defects may be introduced. Since the immersion lithography is now definitely settled in the semiconductors roadmap, there are no other choices than to extent defectivity metrology into the immersion lithography domain.

Among those issues the eventual presence of bubbles or particles in the immersion liquid is of particular importance. The most problematic bubbles and/or particles are those close to the focal point. If no immersion pellicle is used those bubbles or particles would then be directly on top of the resist and could be printed as a defect, as can be seen in the following SEM pictures of FIG. 13. These pictures have been obtained using polystyrene beads deposited on top of a thin TARC, but some in house simulations have been performed and support the idea that a polystyrene bead is the exact mimic of an air bubble in terms of printability.

It has been estimated that a particle or bubble of a few tens of nanometers are sufficient to create a defect in the resist pattern and the challenge is to find a way to detect such a small defect. An optical method has to be used but inspection by means of an SEM is not an attractive option as it may cause contamination and because it is relatively slow. The method according to the invention uses a pellicle to reduce the effect of any bubble or particle. For full process control it may be still required to quantifiy the size and density of the bubbles and/or particles present at the interface of the pellicle and the immersion liquid.

The simplest technique used to detect defects is based upon measurement of scattered light on unpatterned wafers. It is a relatively fast method and the resolution capability is relatively high, down to 80 nm. It is commonly used to monitor the influence of a single process step off-line. However, this method is inefficient in case of bubbles in immersion lithography because bubbles are temporary and happen only during exposure and cannot be detected using scattered light in an off-line tool. The only existing solution is to study defectivity on patterned wafer. There are several tools able to do that, using die-to-die comparison of grabbed images, but all of them have the same disadvantages. The most important is that these techniques are relatively slow, but there are other concerns, intrinsic like the impossibility to detect reticle errors and more practical like the edge dies that take considerable time to make the recipe insensitive. The resolution of patterned wafer defectivity measurement is also not as high as it is on unpatterned wafers since the minimum pixel size is now 0.16 μm.

Capturing defects is only the first part of defect control. Another critical step is the ability to identify the sources of defects quickly so that the problem with the process or equipment can be resolved efficiently with minimum yield impact. It is easy to find the source when only the influence of a single process step is studied by the use of unpatterned wafers but it is getting much more challenging using die-to-die comparison.

According to this aspect of the invention a simple solution to the issue of characterizing bubbles and particles in immersion lithography is provided by printing the immersion defects directly during exposure, using the pellicle described above, which leaves a specific fingerprint in the resist, this finger print can be detect after developing the resist as will be explained below.

The principle is shown schematically in FIG. 14. It consists in depositing an approximately 1.5 μm thick transparent pellicle PE on top of the resist layer L2 and image this stack focusing on top of the pellicle, i.e. at the interface of the pellicle PE and the immersion liquid, instead of focusing in the resist L2 as is normally done. Preferably, an open frame exposure with a highly coherent light source, corresponding to a low a, is used. If a particle P is present, it creates a shadow magnified and with a shape typical for the defect and the illumination system. In case the illumination used is a dipole as is the case in FIG. 14, the resulting shape of the defect will be doubled, but if annular illumination is used, the defect will print as a ring in the resist layer. After development, this shape will be physically printed in the resist and the only resist remaining should then be in the location of the defect as is shown in FIG. 15.

In practice, the shape of the defect is easy to extract from the background noise and the magnification is quite large since the resulting shadow out of 200 nm beads in diameter is then composed of two dots of more than 700 nm in diameter each, separated by a distance of more than 1 micron. This is where the interest of this method comes from since those particles are now detectable by an optical microscope showing a very specific fingerprint. This allows a very fast inspection on the whole surface of the wafer, and the magnification is directly translated to resolution improvement. Thus, in the method according to this aspect of the invention the defect at the interface of the pellicle and the immerison liquid is magnified and printed in the resist layer. The printed defect has a particular shape, depending on the illumination used. The magnification and the shape allow for an easy detection of the particles, using relatively simple high through put screening methods.

As mentioned before, it is also important for defect inspection to be able to find out the origin of the defect, so to know its size and shape. The first selection is intrinsic to the method since only the defects on top of the resist are printed, the defect from the resist itself being out of focus. Moreover the distance between the two doubles patterns printed in the resist is directly linked to the distance between the defect and the resist, so the particles on top of the pellicle will be printed with a specific distance between the two shapes, independent from the size and shape of the original defect. Concerning the size of the defect, it can easily be found back even if there is a magnification since the size of the resist pattern is proportional to the original defect size if the exposure conditions are fixed. Moreover, changing the exposure energy will affect the printability depending on this size so that if an energy meander is applied, different defects sizes will appear for different energy so that a ranking of the defect size would be realized along the energy meander.

Another practical advantage of this method is that the position is determined and can be immediately visualized. The shape and size of the resist pattern are directly related to the shape of the one of original defect (correlated to the illumination shape) so that a classification can be done to determine the origin of the defect.

The most straightforward application of this method is the qualification of a system and/or process, and the example of the bubble detection that will be soon required to qualify the new immersion lithography tools is the proof of the need of such a technique. The bubble induced by topography from previous steps cannot be detected by this method since the thick pellicle is smoothing the topography out, so only the defects that are system dependant such as water flow, showerhead design, water quality due to e.g. degassing, which makes the system qualification aspect visible.

In case the pellicle is used for immersion lithography— note that it may be used for inspection as described in the previous paragraphs—one can think about exposing one die, focusing not in the resist but on top of the pellicle and this die could then be used to check the defect level in-line corresponding to this exposure.

In summary, this aspect of the invention provides a method to detect particles in an immerison lithography tool which has the following advantages:

The resolution is increased due to magnification by the pellicle. The resolution depends on the thickness of pellicle, the NA of the optical system and the resolution of the optical microscope used for inspection of the developed resist.

The origin of the defect can be retrieved: The focus is set on top of the pellicle, thus only the particles in this region will be printed. Moreover, the pitch is fixed and characteristic to the distance between the resist and the particle.

The pattern of the defect printed in the resist can be easily recognized: The pitch is fixed but the pattern is linked to the particle shape. In the example of FIGS. 13 and 14, the size and shape of each dote are linked with the size and shape of the polystyrene bead of 200 nm in this example.

The method is relatively fast: The use of an optical microscope makes this technique very fast and allows the inspection of a complete wafer. However, the method is not restricted to the use of an optical microscope. Other inspection means may be used as well.

The invention claimed is:

1. A method of irradiating a surface of a photosensitive layer (L2) on a substrate (L1) immersed in a fluid (L3), where said irradiation is performed through a removable transparent spacer layer (L4) to pattern said photosensitive layer (L2), the method comprising:
    applying said photosensitive layer (L2) to a top surface of said substrate (L1),
    applying a removable protective transparent layer (L4) to a top surface of the photosensitive layer (L2), wherein the removable protective transparent layer (L4) serves to space apart the photosensitive layer (L2) from the immersion fluid (L3),
    immersing the removable protective transparent layer (L4) in an immersion fluid without dissolving it,
    projecting electromagnetic radiation at a first wavelength onto the top surface of the photosensitive layer (L2) through the immersion fluid (L3) and through the removable protective transparent layer (L4), and
    altering the solubility of the removable protective transparent layer (L4) after the immersion in the immersion fluid by a flood exposure at a second wavelength different from the first wavelength of the projected electromagnetic radiation to ensure that the protective transparent layer (L4) is fully dissolvable, and
    dissolving the removable protective transparent layer (L4) in a developer solution thereby exposing the photosensitive layer (L2) to the developer solution, thus allowing the photosensitive layer (L2) to be developed;
    wherein the thickness of the removable protective transparent layer (L4) is greater than or equal to 200 nm.

2. The method of claim 1, wherein the projecting comprises projecting a pattern onto the photosensitive layer (L2).

3. The method of claim 2, wherein the photosensitive layer (L2) is a resist layer (L2) and the projecting comprises projecting a pattern to pattern the resist layer (L2) to form a patterned resist layer (L2).

4. The method of claim 3, further comprising a step of using the patterned resist layer (L2) as a mask in a further lithographic step.

5. The method according to claim 1, wherein the thickness of the removable protective transparent layer (L4) is such that imperfections in the immersion fluid are out of focus as projected on the surface.

6. The method of claim 2, wherein the step of the removal of the removable protective transparent layer (L4) precedes or is combined with a step of developing the photosensitive layer (L3).

7. The method of claim 1, the removable protective transparent layer (L4) being removed by dissolving with a dissolving fluid.

8. The method according to claim 7, wherein the dissolving fluid is used for developing the photosensitive layer (L3).

9. The method of claim 1, wherein the removable protective transparent layer (L4, L5) comprises an upper (L5) and a lower layer (L4), the upper layer (L5) having an alterable solubility.

10. The method of claim 8, the lower layer (L4) having a filter function to protect the resist layer (L2) from the altering step.

11. The method of claim 1, wherein the wherein the thickness of the removable transparent layer is greater than or equal to 500 nm.

12. The method of claim 1, wherein the wherein the thickness of the removable transparent layer is greater than or equal to 1 micron.

13. The method of claim 1, wherein the wherein the thickness of the removable transparent layer is greater than or equal to 5 micron.

14. A method of irradiating a surface (L1, L2) comprising a photosensitive layer (L2) on a substrate (L1), wherein the surface (L1, L2) is immersed in an immersion fluid (L3), the method comprising:
    applying a removable protective transparent layer (L4) to the surface (L1, L2), wherein the removable protective transparent layer (L4) serves to space apart the surface (L1, L2) from the immersion fluid (L3),
    projecting electromagnetic radiation onto the photosensitive layer (L2) of the surface (L1, L2) through the immersion fluid (L3) and through the removable protective transparent layer (L4), and
    immersing the removable protective transparent layer (L4) in an immersion fluid without dissolving it,
    altering the solubility of the removable protective transparent layer (L4) after the immersion in the immersion fluid by a post exposure bake process, and
    dissolving the removable protective transparent layer (L4) in a developer solution thereby exposing the photosensitive layer (L2) to the developer solution, thus allowing the photosensitive layer (L2) to be developed;

wherein the thickness of the removable protective transparent layer (L4) is greater than or equal to 200 nm.

15. The method of claim 14, wherein the wherein the thickness of the removable transparent layer is greater than or equal to 500 nm.

16. The method of claim 14, wherein the wherein the thickness of the removable transparent layer is greater than or equal to 1 micron.

17. The method of claim 14, wherein the wherein the thickness of the removable transparent layer is greater than or equal to 5 micron.

* * * * *